(12) United States Patent
Sadasivam et al.

(10) Patent No.: US 8,525,609 B1
(45) Date of Patent: Sep. 3, 2013

(54) PULSE WIDTH MODULATION CIRCUITS, SYSTEMS AND METHODS

(75) Inventors: Kannan Sadasivam, Cochin (IN); Rajiv Vasanth Badiger, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 55 days.

(21) Appl. No.: 13/246,589

(22) Filed: Sep. 27, 2011

(51) Int. Cl.
*H03K 7/08* (2006.01)
(52) U.S. Cl.
USPC .......................................... 332/109; 327/172
(58) Field of Classification Search
USPC .......................... 332/109; 327/172; 375/238
See application file for complete search history.

(56) References Cited

U.S. PATENT DOCUMENTS

| | | | | |
|---|---|---|---|---|
| 7,710,174 | B2 * | 5/2010 | Prodi et al. | 327/172 |
| 2009/0296805 | A1 * | 12/2009 | Takahashi | 375/238 |

\* cited by examiner

*Primary Examiner* — Joseph Chang (57) ABSTRACT

A pulse width modulation (PWM) system can include at least a first pulse width modulation circuit that generates a first pulse width modulated signal in synchronism with a first clock signal; a source circuit that provides a second pulse width modulated signal that is phase shifted with respect to the first pulse width modulated signal; and output logic that logically combines the first and second pulse width modulated signals to generate a pulse width modulated output signal.

20 Claims, 11 Drawing Sheets

PULSE WIDTH MODULATION CIRCUITS, SYSTEMS AND METHODS

TECHNICAL FIELD

The present disclosure relates generally to time density modulation systems, and more particularly to pulse width modulation systems and methods.

BACKGROUND

Figure 18:
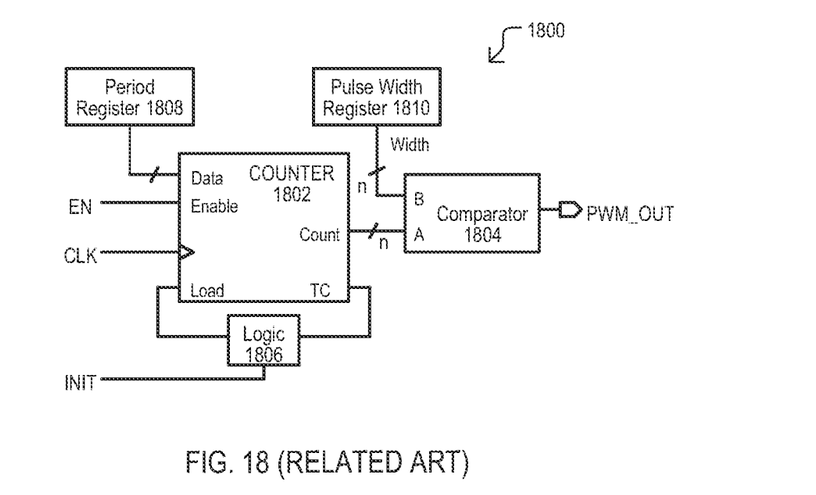
FIG. 18 is a block schematic diagram of a conventional PWM circuit.

FIG. 18 shows a conventional pulse width modulation (PWM) circuit 1800 that includes a counter circuit 1802, a comparator 1804, reset logic 1806, a period register 1808, and a pulse width register 1810.

In operation, a counter circuit 1802 can increment a "Count" output value in response an input clock signal CLK. While a count value (Count) is less than a "Width" value provided by pulse width register 1810, a comparator 1804 may drive output signal PWM_OUT to one level (e.g., high or low). However, when the count value (Count) exceeds value Width, comparator 1804 can drive output signal PWM_OUT to the other level (e.g., low or high).

Figure 19:
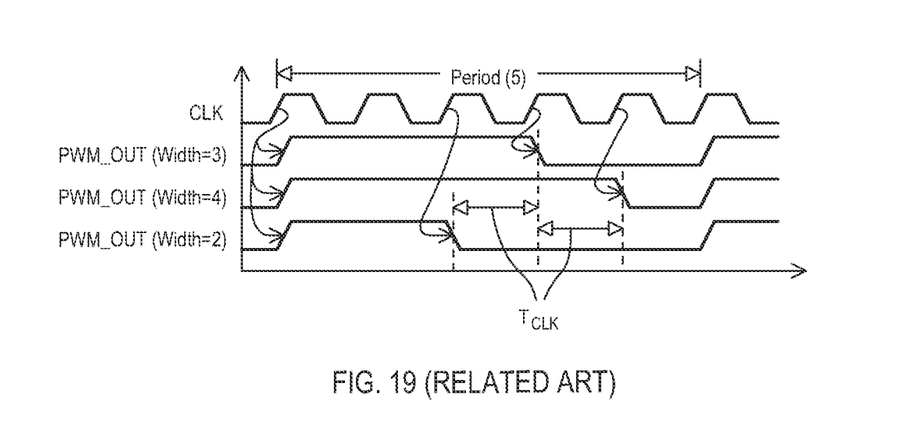
FIG. 19 is a timing diagram showing the operation of a conventional PWM circuit like that of FIG. 18.

Once a terminal count value is reached, a terminal count output (TC) can be activated, and a count value within counter circuit 1802 can be reset to a start value (less than Width) through reset logic 1806. The process can then repeat for a next PWM_OUT cycle. A period register 1808 can provide the terminal count value, and thus establish period of output signal PWM_OUT, FIG. 19 is a timing diagram showing the operation of conventional PWM circuit like that of FIG. 18. FIG. 19 includes a waveform for an input clock signal (CLK) as well as three different examples of output signal PWM_OUT corresponding to different Width values (i.e., Width=3, 4, 2). FIG. 19 shows how a pulse width of an output signal PWM_OUT can be varied by a Width value. However, the resolution of pulse width changes is limited to increments of $T_{CLK}$, where $T_{CLK}$ is the period of input clock signal (CLK). To increase a pulse width resolution in the conventional system, a frequency of input clock (CLK) is increased.

DETAILED DESCRIPTION

Various embodiments will now be described that show pulse width modulation (PWM) circuits, systems and methods, that can generate pulse widths based on an input clock period but also provide a high degree of pulse width resolution by logically combining multiple pulses that are phase shifted with respect to one another.

In the various embodiments shown below, like section are referred to by the same reference character but with the first digit(s) corresponding to the figure number.

Figure 1:
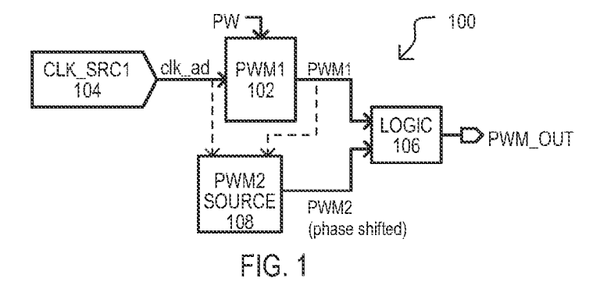
FIG. 1 is a block schematic diagram of a pulse width modulation (PWM) system according to an embodiment.

FIG. 1 shows a pulse width modulation (PWM) system 100 according to an embodiment. A system 100 can include a PWM circuit 102, a first clock source 104, output logic 106, and a second PWM source circuit 108. A first clock source 104 can provide an input clock signal clk_ad for PWM circuit 102. In some embodiments, a first clock source 104 can be an external clock received by system 100. However, in other embodiments, a first clock source 104 can be a generated clock, such as an oscillator, or a clock generated from a received clock, such as that provided by a phase lock loop (PLL) or delay lock loop (DLL). Further, in some embodiments, a first clock source 104 can provide an adjustable phase delay to input clock signal clk_ad.

PWM circuit 102 can receive input clock signal clk_ad and a pulse width value PW, and in response provide a first pulse width modulated signal PWM1. Signal PWM1 can have a pulse width proportional to a period of input signal clk_ad. In some embodiments, pulses of signal PWM1 can have durations that are a multiple of the input clock period, or a multiple of ½ the input clock period. That is, a pulse width (Tpulse) can be:

$$Tpulse=PW*Tclk\_ad \text{ or } Tpulse=PW*(\tfrac{1}{2})Tclk\_ad$$

where Tclk_ad is the period of clock clk_ad and PW is an integer. A value PW can be varied to modulate a pulse width of signal PWM1.

In addition or alternatively, a PWM circuit 102 can provide pulses that are synchronous with an input clock signal clk_ad. That is, rising and falling edges of a pulse may have a same phase difference with corresponding edges of a clock signal.

A second PWM source circuit 108 can provide a second pulse width modulated signal PWM2 that can be phase shifted with respect to the first pulse width modulated signal PWM1. In particular embodiments, such a phase shifting can be less than a clock period Tclk_ad, and preferably less than (½)Tclk_ad. A phase shift between signals PWM1 and PWM2 can be produced by phase shifting one or both of signals PWM1 and PWM2 with respect to one another.

In some embodiments, a second PWM source circuit 108 can include a second PWM circuit that varies a pulse width of PWM2 independent of PWM1. However, in other embodiments, a second PWM source circuit 108 can derive signal PWM2 from signal PWM1.

Output logic 106 can logically combine signals PWM1 and PWM2 to generate an output signal PWM_OUT. While output logic 106 can take various forms according to a desired output signal, in a particular embodiment, output logic 106 can be a logic OR-like function. An OR-like function can include an OR or NOR gate, or even and AND or NAND gate with suitable intervening logic. When a phase shift between signals PWM1 and PWN2 is less than Tclk_ad, a pulse width of output signal PWM_OUT can be varied by less than Tclk_ad, and thus provide greater resolution that of PWM circuit 102 alone.

In this way, a PWM system can logically combine two or more pulse width modulated signals that are phase shifted with respect to one another to provide greater pulse width resolution than any of the pulse width modulated signals alone.

Figure 2:
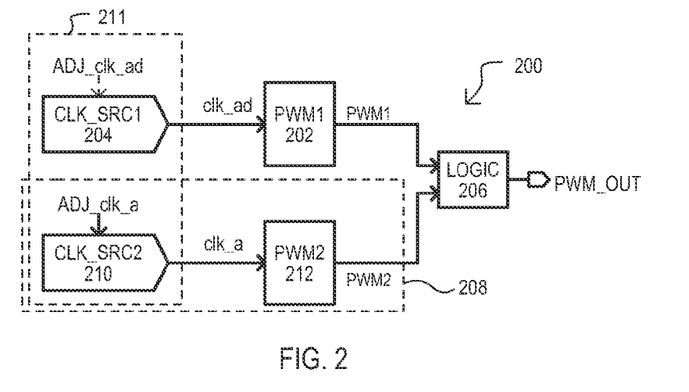
FIG. 2 is a block schematic diagram showing a PWM system according to another embodiment.

FIG. 2 shows a PWM system 200 according to another embodiment. FIG. 2 can have sections like those of FIG. 1. FIG. 2 differs from that of FIG. 1 in that a second PWM source circuit 208 is shown to include a second clock source 210 and a second PWM circuit 212. A second clock source 210 can provide an input clock signal clk_a for second PWM circuit 212. Like first clock source 204, in some embodiments, a second clock source 210 can be an external clock received by system 200, or alternatively, can be a generated clock, such as an oscillator, or that provided from a PLL or DLL. Still further, in some embodiments, a second clock source 210 can generate clk_a from clk_ad.

In the embodiment shown, second clock source 210 can phase shift clock clk_a in response to an adjustment value ADJ_clk_a. Consequently, a phase difference between clk_a and clk_ad can be varied. In particular embodiments, an adjustment value ADJ_clk_a can provide one of multiple phase shift increments that are a fraction of a clock period Tclk_a.

Optionally, a first clock source 204 can also phase shift its clock (clk_ad) in response to an adjustment value ADJ_clk_ad. As in the case of second clock source 210, an adjustment value ADJ_clk_ad can provide one of multiple phase shift increments that are a fraction of a clock period Tclk_ad.

A second PWM circuit 212 can receive input clock signal clk_a and a pulse width value PW2, and in response, provide a second pulse width modulated signal PWM2. Second PWM circuit 212 can operate in the same manner as first PWM circuit 204, varying a pulse width in response to value PW2. In one embodiment, a pulse width of signal PWM2 can be an integer multiple of Tclk_a or (½)Tclk_a.

Output logic 206 can logically combine signals PWM1 and PWM2 as described for output logic 106 of FIG. 1.

In one embodiment, a first clock source 204 and a second clock source 210 may originate within a same clock generator circuit 211. A clock generator circuit 211 can provide clock signals clk_ad and clk_a as described herein, and equivalents.

In this way, a PWM system can logically combine two or more pulse width modulated signals, generated by separate PWM circuits, that are phase shifted with respect to one another.

Figure 3:
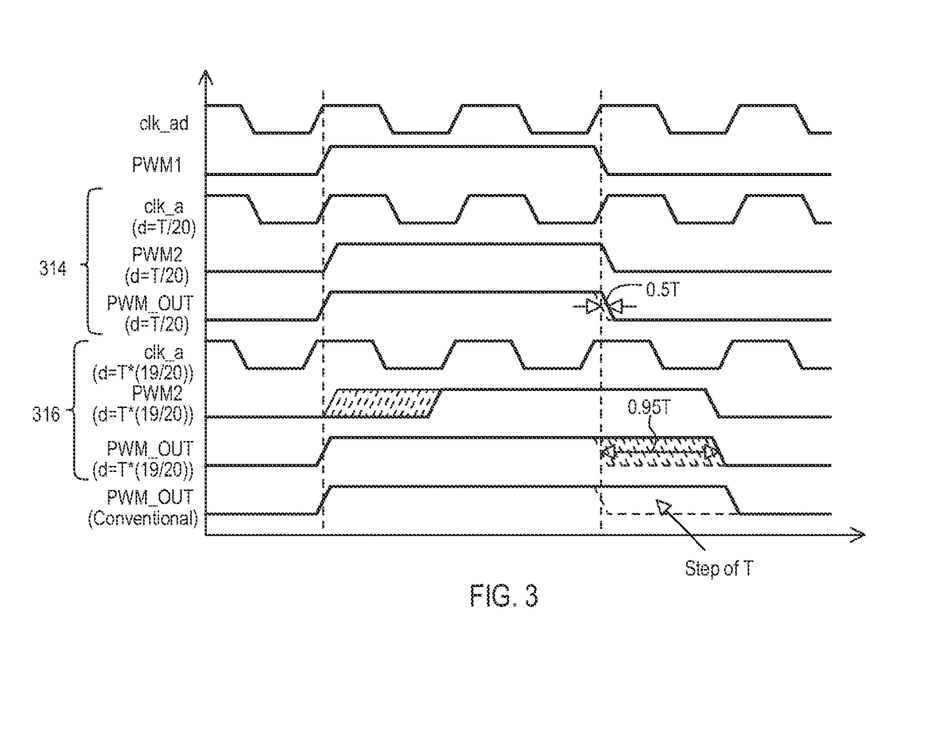
FIG. 3 is a timing diagram showing operations of an embodiment like that of FIG. 2.

FIG. 3 is a timing diagram showing particular operations for a PWM system according to an embodiment like that of FIG. 2. FIG. 3 includes waveforms for a first clock signal (clk_ad) and a first pulse width modulated signal (PWM1) having a pulse width proportional to a period of clk_ad.

FIG. 3 also shows two responses 314 and 316, corresponding to different phase shifts between first and second PWM signals (PWM1 and PWM2). FIG. 3 also shows a conventional pulse width modulation response (PWM_OUT (Conventional)) in which pulse widths can be adjusted only by steps of one clock cycle.

Both responses (314 and 316) include waveforms: for a second clock signal (clk_a) which is phase shifted with respect to first clock signal (clk_ad), a second pulse width modulated signal (PWM2) that is phase shifted with respect to signal PWM1, and an output signal (PWM_OUT) generated by logically ORing signals PWM1 and PWM2.

In the particular embodiment shown, clocks clk_a and clk_ad have a same frequency. Signals PWM1 and PWM2 have a same pulse width of two clock cycles (2*Tclk_a/ 2*Tclk_ad). Further, a phase difference between clocks clk_a and clk_ad results in a corresponding phase difference between signals PWM1 and PWM2.

Response 314 shows a response when a phase difference between signals PWM1 and PWM2 is $\frac{1}{20}$ of a clock cycle (T/20, where T=Tclk_a=Tclk_ad). As shown, a resulting output signal PWM_OUT(d=T/20) can have a pulse width of 2.05*T.

Response 316 shows a response when a phase difference between signals PWM1 and PWM2 is 19/20 of a clock cycle. As shown, a resulting output signal PWM_OUT(d=T*(19/ 20)) can have a pulse width of 2.95*T.

As understood from responses 314 and 316, a phase difference between PWM1 and PWM2 can be adjusted to modulate a pulse to additional widths that include fractions of T. Further, while FIG. 3 shows pulse width increments of 0.05*T, other embodiments can include shorter or longer increments. Such pulse width resolution is in contrast to the conventional case (PWM_OUT (Conventional)) providing steps of one clock cycle.

Figure 4:
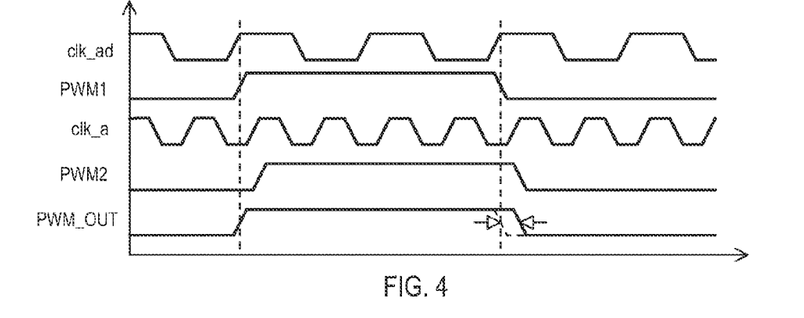
FIG. 4 is a timing diagram showing alternate operations of an embodiment like that of FIG. 2.

While the embodiment of FIG. 3 shows clock signals clk_ad and clk_a having a same frequency, alternate embodiments can include clocks with different frequencies. FIG. 4 shows one example of such an embodiment.

FIG. 4 is a timing diagram showing waveforms like those of FIG. 3. However, unlike FIG. 3, in FIG. 4 input clock signals have different frequencies. In particular, a clock signal clk_a can have a higher frequency than clock signal clk_ad. A PWM circuit can modulate a pulse width based on clk_a (in the embodiment shown a width of four clock cycles). A first and second clock signals clk_ad and clk_a can be phase shifted with respect to one another by an amount shorter than the clock period of either clock signal.

An output signal PWM_OUT can have a higher resolution pulse width (higher than conventional systems that modulate by clock cycle steps) by a logically ORing of signals PWM1 and PWM2, as described for FIG. 3.

It is understood that while FIG. 4 shows one clock signal clk_ad being double the frequency of clock signal clk_a, alternate embodiments can frequencies that are not integer multiples of one another.

In this way, a PWM system can logically combine two or more pulse width modulated signals generated from clock signals of different frequencies that are phase shifted with respect to one another.

PWM systems and circuits as described herein can be realized with fixed circuits (i.e., non=programmable circuits, such as those of an application specific integrated circuit (ASIC)). However, in some embodiments, all or a portion of a PWM system or circuit can be realized with programmable circuits. Such an embodiment can enable higher pulse width modulation resolution without having to provide a faster frequency clock. One particular embodiment realized with programmable logic is shown in FIG. 5.

Figure 5:
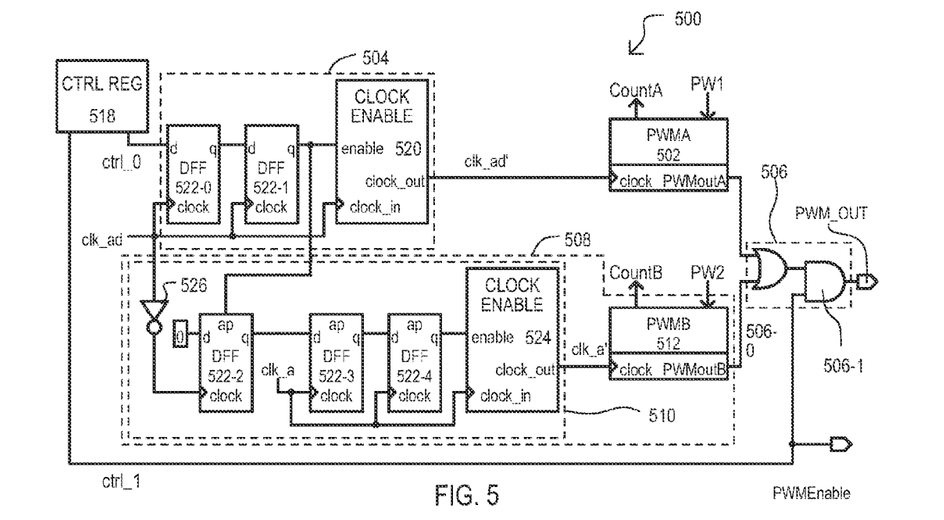
FIG. 5 is a block schematic diagram of a PWM system according to a further embodiment.

FIG. 5 shows a PWM system 500 according to a further embodiment. A PWM system 500 can include a first PWM circuit 502, a first clock source 504, output logic 506, a second PWM source circuit 508, and a control register 518. A first clock source 504 can include a first clock enable circuit 520 and D-type flip-flop (DFF) circuits 522-0, -1. As will be described in more detail below, first clock source 504 can be controlled by a control register 514 to ensure an proper phase relationship (i.e., leading or lagging) between pulse width modulated signals PWMoutA and PWMoutB.

A first PWM circuit 502 can be programmed to generate an output signal PWMoutA with a pulse width based on a number of input clock signal periods (Tclk_ad') or half periods (Tclk_ad'). In one embodiment, a PWM circuit 502 can be a counter based PWM circuit that generates a pulse width according to a count value, and a count value (CountA) can be output or read from the PWM circuit.

A second PWM source circuit 508 can include a second PWM circuit 512 and a second clock source 510. A second clock source 510 can include a second clock enable circuit 524, D-type flip-flop (DFF) circuits 522-2 to -4, and inverter 526. A second PWM circuit 508, like first PWM circuit 502, can be programmed to generate an output signal PWMoutB with a pulse width based on a number of input clock signal periods (Tclk_a') or half periods (Tclk_a'). In one embodiment, a PWM circuit 512 can be a counter based PWM circuit, and a count value (CountB) can be output or read from the PWM circuit.

Like first clock source 504, second clock source 510 can be controlled by a control register 514 to ensure an proper phase relationship (i.e., leading or lagging) between pulse width modulated signals PWMoutA and PWMoutB.

In operation, control register 518 can output values that can ensure that pulse width modulated signal PWMoutA lags signal PWMoutB. In the particular embodiment shown, initially a control output value ctrl_0 can be low, and DFF circuits 522-0 to -4 can output low values, disabling clock enable circuits 520 and 524.

To start a PWM operation, control register 518 can be written to output a high ctrl_0 value. Such a high value will be clocked through DFF circuits 522-0/1 to enable first clock enable circuit 520. Once enabled, first clock enable circuit 520 can then apply a first clock signal clk_ad' to first PWM circuit 502, which can generate a pulse width modulated signal PWMoutA.

At the same time, the high value output from DFF circuit 522-2 can be applied to DFF circuit 522-2, to cause its output q to go high. Such a value will propagate through DFF circuits 522-3 and -4 to enable second clock enable circuit 524. When enabled, second clock enable circuit 524 can then apply a second clock signal clk_a' to second PWM circuit 508, which can generate a pulse width modulated signal PWMoutB. In this way, by operation of DFF circuits 522-0 to -4, PWMoutB will lag PWMoutA.

Output logic 506 can include an OR circuit 506-0 to logically combine signals PWMoutA and PWMoutB to enable high resolution pulse width modulation as described herein. In the embodiment shown, output logic 506 can also include an output enable gate 506-1 to selectively enable a pulse width modulation output signal in response to a value ctrl_1 provided by control register 518. As will be described in more detail below in conjunction with FIG. 6, an output can be disabled to allow for a circuit initialization.

As noted above, FIG. 5 can be implemented all, or in part, by programmable logic circuits. In one very particular embodiment, a PWM system 500 can be implemented with a PsoC® 3 or 5 Programmable System on Chip integrated circuit (IC) device manufactured by Cypress Semiconductor Corporation of San Jose, Calif., U.S.A. A clock signal clk_ad can be a clock signal provided by an oscillator circuit. A clock signal clk_a can be a phase shifted version of clk_a generated on the same IC device. DFF circuits (522-0 to -4), clock enable circuits (520 and 524), and PWM circuits (502 and 512) can be realized with universal digital blocks (UDB) that can be configured and interconnected with suitable configuration data. In one embodiment, clk_a and clk_ad can have frequencies of 48 MHz, with clk_a being phase shifted with respect to clk_ad by 1 ns increments up to 10 ns. Further, clk_a can be inverted, to provide 10 more 1 ns increments, for a total of 20 ns in possible phase shifting. A PWM output (PWM_OUT) can have a frequency of 500 kHz.

Figure 6:
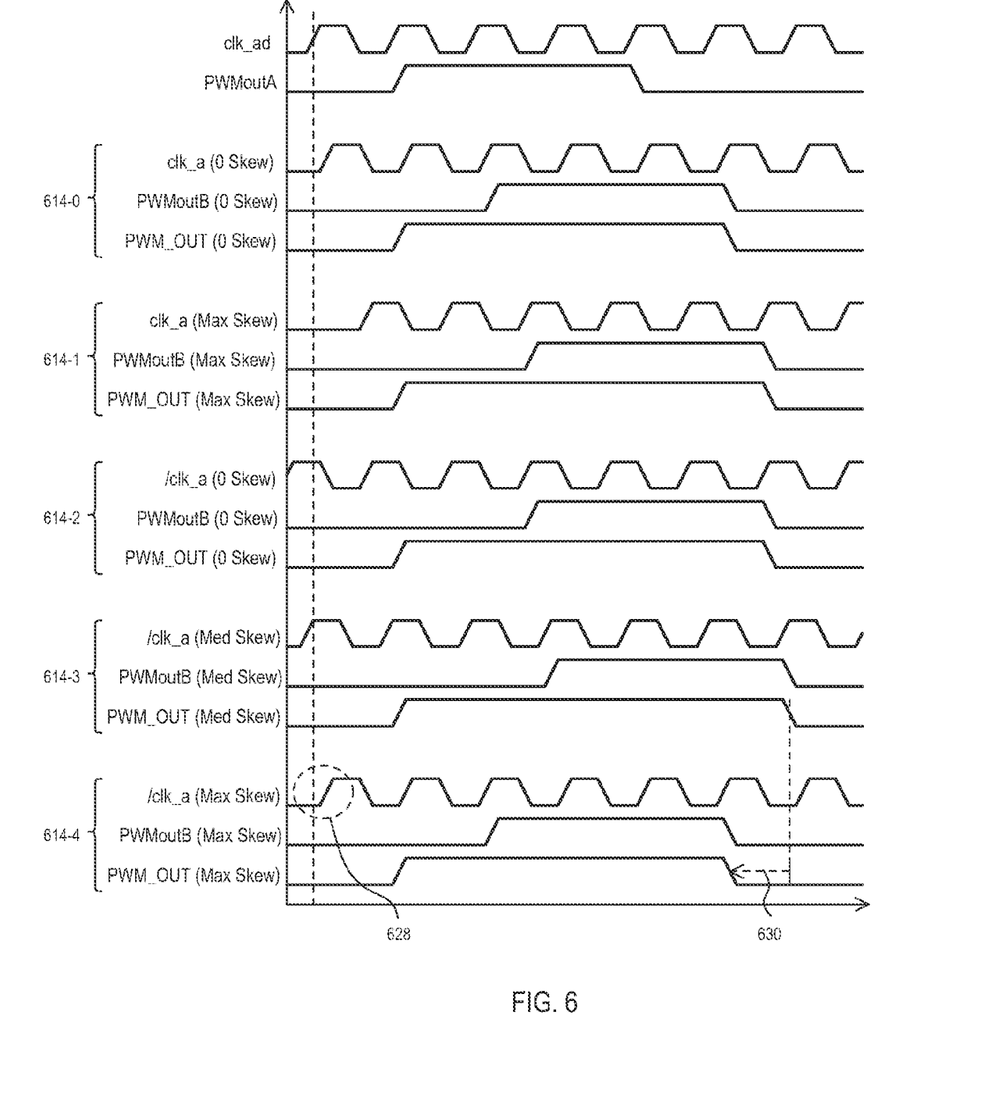
FIG. 6 is a timing diagram showing operations for an embodiment like that of FIG. 5.

FIG. 6 is a timing diagram showing particular operations for the embodiment of FIG. 5. FIG. 6 includes waveforms for a first clock signal clk_ad, as well as a resulting pulse width modulated signal (PWMoutA) generated by a PWM circuit from the first clock signal clk_ad.

FIG. 6 also shows five different responses (614-0 to -4) of a PWM system corresponding to different phase delays in a second clock signal clk_a. Each response shows a waveform for a second clock signal (clk_a), a pulse width modulated signal (PWMoutB) generated by a PWM circuit from the second clock signal clk_a, and an output signal (PWM_OUT) generated by logically ORing pulse width modulated signals PWMoutA and PWMoutB.

Responses 614-0 and -1 show responses for minimum and maximum skew (phase delay) between clk_ad and clk_a. As shown, as a skew is increased, a resulting pulse width of output signal (PWM_OUT) is increased. Such increases are less than a period of clocks clk_ad/clk_a.

Responses 614-2 to -4 show responses for various amounts of skew when utilizing the inverse of clk_a (/clk_a) to generate second pulse width modulated signal (PWMoutB).

In the particular embodiment shown, response 614-4 shows how with a maximum skew in signal /clk_a, a positive edge of signal /clk_a can "cross over" that of clk_ad (noted by 628). In such a case, a phase shift between a pulse in signal PWMoutB can be suddenly pulled forward (noted by 630). That is, sequential increases in skew can result in larger pulse widths until a positive edge of the lagging clock crosses over that of the leading clock, causing a sudden decrease in pulse width. Embodiments can include an initialization operation to prevent such a decrease in pulse width. One such initialization operation is shown in FIG. 7.

Figure 7:
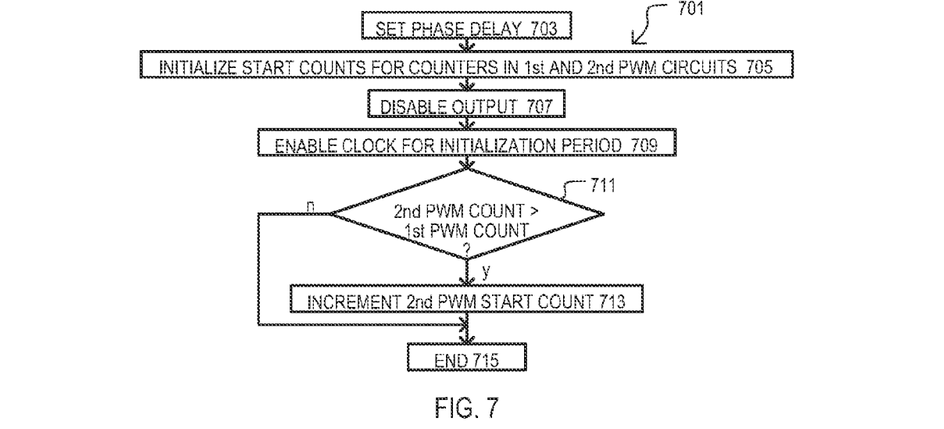
FIG. 7 is a flow diagram showing an initialization operation for an embodiment like that of FIG. 5.

FIG. 7 is a flow diagram 701 showing an initialization operation that can be executed for each change in phase delay (i.e., change in phase between clk_a and clk_ad) to check for a clock "cross over" event, like that noted above in the description of FIG. 6. An operation 701 can include setting a phase delay (703). Such an action can include establishing a delay between a leading clock (e.g., clk_ad) and a lagging clock (e.g., clk_a).

Start counts for counters within first and second PWM circuits can be initialized (705). An output can be disabled (707). Such an action can include preventing a PWM_OUT signal from being output from a system (e.g., driving value ctrl_1 low).

A clock can then be enabled for an initialization period (709). Such an action includes applying a clock signals to first and second PWM circuits to enable such circuits to generate count values based on periods of a received clock signals.

If a count value of the second (i.e., lagging) PWM circuit is not greater than that of the first (i.e., leading) PWM circuit (n from 711), then an operation 701 can be complete (715). However, if a count value of the second PWM circuit is greater than that of the first PWM circuit (n from 711), then a start count value for the second PWM circuit can be incremented (713). An operation 701 can then be complete (715).

Figure 8A:
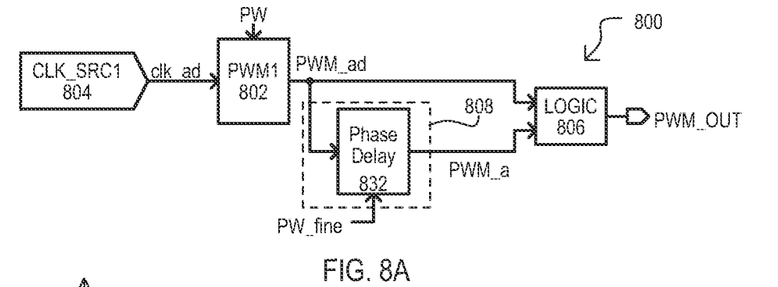
FIGS. 8A and 8B show a block schematic diagram and timing diagram of a PWM system according to an embodiment.

FIG. 8A shows a PWM system 800 according to a further embodiment. FIG. 8A can have sections like those of FIG. 1. FIG. 8A differs from that of FIG. 1 in that a second PWM source circuit 808 is shown to receive a pulse width modulated signal PWM_ad received from a PWM circuit 802 and output a phase delayed version of such a signal as PWM_a. In the embodiment shown, second PWM source circuit 808 can include a phase delay circuit 832 that can introduce a phase delay into signal PWM_ad to generate signal PWM_a. It is understood that the phase delay provided by phase delay circuit 832 can establish the resolution of PWM system. Thus, in particular embodiments, such a phase delay can be varied in response to a modulation value (PW_fine).

In one embodiment, a phase delay provided by phase delay circuit 832 can be less than a period of the input clock signal clk_ad.

Output logic 806 can logically combine pulse width modulated signals (PWM_ad and PWM_a) to generate an output signal PWM_OUT.

In this way, a PWM system can logically combine a pulse width modulated signal with a phase delayed version of the same signal to provide greater pulse width resolution than the pulse width modulated signals alone.

Figure 8B:
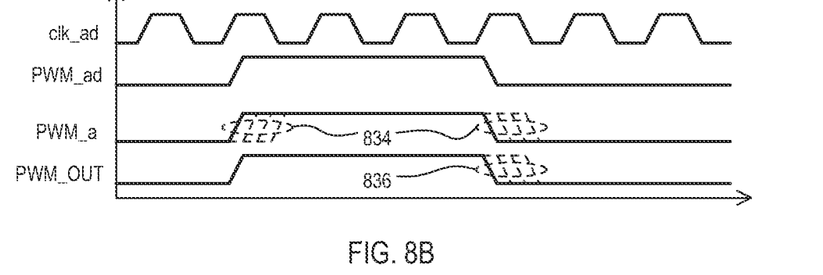

FIG. 8B is a timing diagram showing operations for a system like that shown in FIG. 8A. FIG. 8B shows waveforms for an input clock signal (clk_ad) upon which pulse widths are based, the pulse width modulated signal (PWM_ad) output from PWM circuit, the phase delayed pulse width modulated signal (PWM_a), and output signal (PWM_OUT).

As shown in FIG. 8B, a phase delay circuit (e.g., 832) can introduce any of multiple delays (noted by 834) to establish a phase delay between signal PWM_a and PWM_ad. Such phase delays can enable a pulse width of output signal PWM_OUT to be modulated with greater resolution (noted by 836).

Figure 9A:
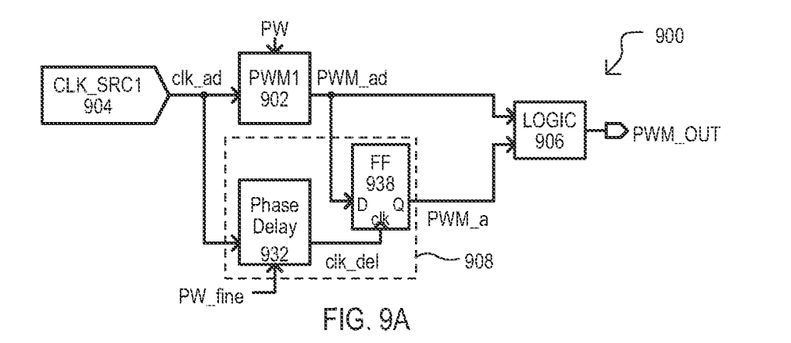
FIGS. 9A and 9B show a block schematic diagram and timing diagram of a PWM system according to a further embodiment.

FIG. 9A shows a PWM system 900 according to another embodiment. FIG. 9A can have sections like those of FIG. 1. FIG. 9A differs from that of FIG. 1 in that a second PWM source circuit 908 is shown to receive an input clock clk_ad as well as a pulse width modulated signal PWM_ad generated from a PWM circuit 902.

In the embodiment shown, second PWM source circuit 908 can include a phase delay circuit 932 and a DFF circuit 938. A phase delay circuit 932 can receive clock signal clk_ad and introduce a phase delay into such a clock signal to generate a delayed clock signal clk_del. DFF circuit 938 can receive the pulse width modulated signal PWM_ad as an input data signal (D), and delayed clock signal clk_del as a clock input. A DFF circuit 938 output (Q) can be a phase shifted pulse width modulated signal PWM_a. It is understood that the phase delay provided by phase delay circuit 832 can establish the resolution of PWM system. Thus, in particular embodiments, such a phase delay can be varied in response to a modulation value (PW_fine).

A system 900 may introduce pulse shortening like that noted by 630 in FIG. 6. Thus, in some embodiments, an initialization operation can detect pulse shortening by monitoring for a drop in pulse width while a phase delay is increased. If such a pulse shortening is detected, an initial count for PWM circuit 902 can be incremented.

Output logic 906 can logically combine pulse width modulated signals (PWM_ad and PWM_a) to generate an output signal PWM_OUT.

In this way, a PWM system can logically combine a pulse width modulated signal with a phase delayed version of the same signal created by gating the pulse width modulated signal with a delayed clock signal.

Figure 9B:
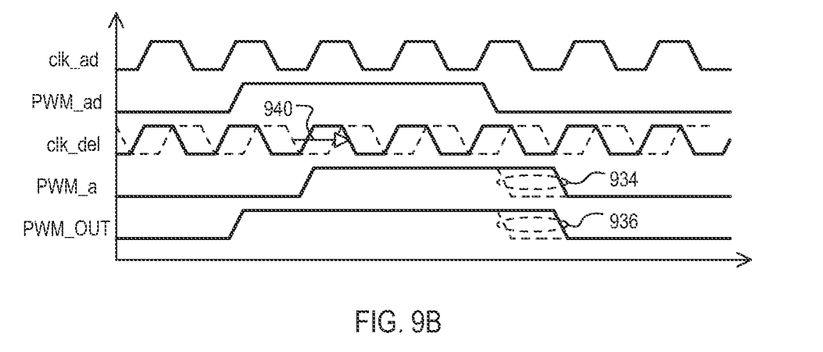

FIG. 9B is a timing diagram showing operations for a system like that shown in FIG. 9A. FIG. 9B shows waveforms for an input clock signal (clk_ad) upon which pulse widths are based, the pulse width modulated signal (PWM_ad) output from PWM circuit, the phase delayed pulse width modulated signal (PWM_a), and output signal (PWM_OUT).

As shown in FIG. 9B, a phase delay circuit (e.g., 932) can introduce any of multiple delays (noted by 940) to establish a phase delay in delayed clock signal clk_del. Such delays in delayed clock signal clk_del can increase a phase delay in a second pulse width modulated signal PWM_a (noted by 934). Phase delays between pulse width modulated signals PWM_ad and PWM_a can enable a pulse width of output signal PWM_OUT to be modulated with greater resolution (noted by 936).

Figure 10A:
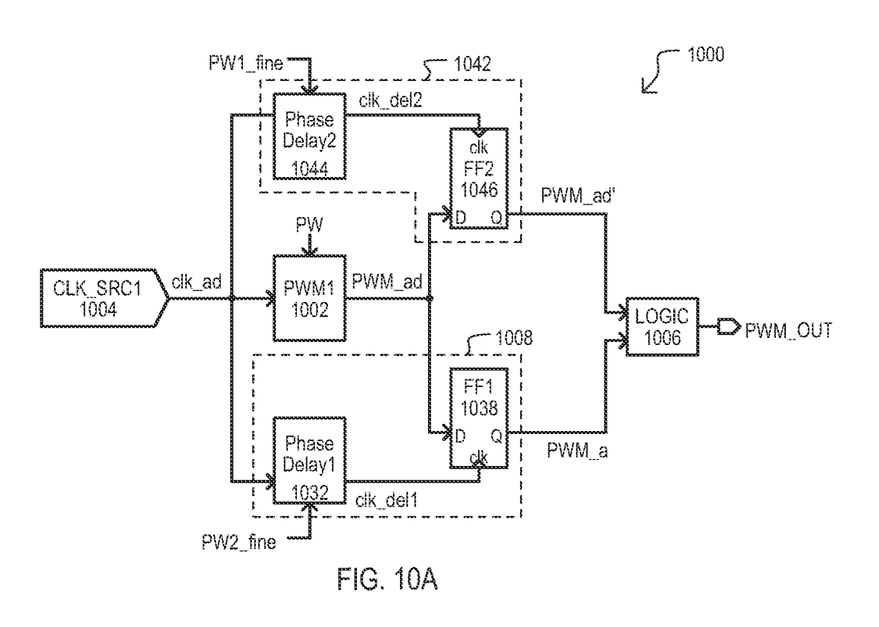
FIGS. 10A and 10B show a block schematic diagram and timing diagram of a PWM system according to another embodiment.

FIG. 10A shows a PWM system 1000 according to another embodiment. FIG. 10A can have sections like those of FIG. 9A. FIG. 10A differs from that of FIG. 9A a pulse width modulated signal PWM_ad generated by PWM circuit 1002 is not applied directly to output logic 1006, but instead is gated by a gating circuit 1042.

A gating circuit 1042 can include a second phase delay circuit 1044 and a second DFF circuit 1046. A phase delay circuit 1044 can receive clock signal clk_ad and introduce a phase delay (established by value PW1_fine) to generate a second delayed clock signal clk_del2. In a similar fashion to a first PWM source circuit 1008, DFF circuit 1046 can receive the pulse width modulated signal PWM_ad as an input data signal (D), and second delayed clock signal clk_del2 as a clock input. Accordingly, a first DFF circuit 1038 can output a first phase shifted pulse width modulated signal (PWM_a), while a second DFF circuit 1046 outputs a second phase shifted pulse width modulated signal (PWM_ad'). Signals PWM_a and PWM_ad' can be logically combined within output logic 1006 to generate an output signal PWM_OUT.

In a particular embodiment, phase delays introduced by phase delay circuits (1032 and 1044) establish the resolution of PWM system. Thus, in particular embodiments, such phase delays can be varied in response to modulation values (PW1_fine, PW2_fine).

As in the case of the embodiment of FIG. 9A, a system 1000 may introduce pulse shortening like that noted as 630 in FIG. 6. Thus, in some embodiments, an initialization operation can detect pulse shortening by monitoring for a drop in pulse width as relative phase delay is increased. If such a pulse shortening is detected, an initial count for PWM circuit 1002 incremented.

Output logic 1006 can logically combine pulse width modulated signals (PWM_ad' and PWM_a) to generate an output signal PWM_OUT.

In this way, a PWM system can gate a pulse width modulated signal to output logic with clock signals that are phase shifted with respect to one another.

Figure 10B:
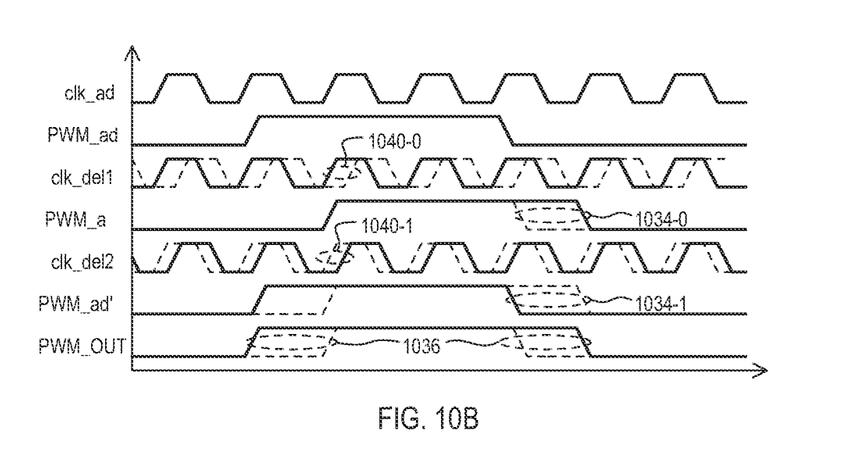

FIG. 10B is a timing diagram showing operations for a system like that shown in FIG. 10A. FIG. 10B shows waveforms for an input clock signal (clk_ad) upon which pulse widths are based, the pulse width modulated signal (PWM_ad) output from PWM circuit, a first delayed clock signal (clk_del1) that gates signal PWM_ad to generate a first phase delayed pulse width modulated signal (PWM_a), a second delayed clock signal (clk_del2) that gates signal PWM_ad to generate a second phase delayed pulse width modulated signal (PWM_ad'), and output signal (PWM_OUT).

As shown in FIG. 10B, a phase delay circuits (e.g., 1032 and 1044) can introduce any of multiple delays (noted by 1040-0/1) in delayed clock signals clk_del1 and clk_del2. Such delays correspond to phase delays in pulse width modulated signals PWM_a and PWM_ad' (noted by 1034-0/1). Phase delays between pulse width modulated signals PWM_ad and PWM_a can enable a pulse width of output signal PWM_OUT to be modulated with greater resolution (noted by 1036).

Figure 11A:
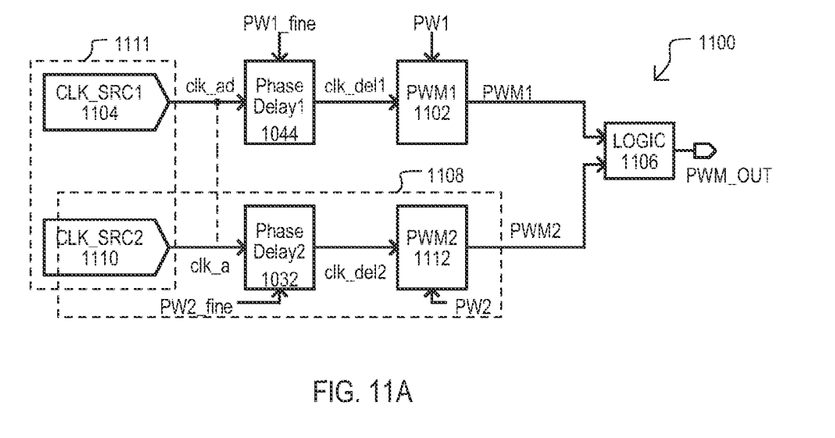
FIGS. 11A and 11B show a block schematic diagram and timing diagram of a PWM system according to a further embodiment.

FIG. 11A shows a PWM system 1100 according to another embodiment. FIG. 11A can have items like those of FIG. 2. FIG. 11A differs from FIG. 2 in that a first phase delay circuit 1044 can be positioned between first clock source 1104 and a first PWM circuit 1102, and a second phase delay circuit 1032 can be situated between second clock source 1110 and a second PWM circuit 1012.

A first clock signal (clk_ad) can be provided by first clock source 1104 to first phase delay circuit 1044. Such a clock signal (clk_ad) can be phase delayed to create a first delayed clock signal clk_del1. First PWM circuit 1102 can generate a first pulse width modulated signal PWM1 based on delayed clock signal clk_del1. In particular embodiments, first PWM circuit 1102 can generate pulse widths that are proportional to periods of clock signal clk_del1. Further in some embodiments, an amount of phase delay provided by first phase delay circuit 1044 is selectable (by value PW1_fine) to provide finer pulse width resolution.

In a similar fashion, a second clock signal (clk_a) from second clock source 1110 can be phase delayed by second phase delay circuit 1032 and the delayed clock (clk_del2) provided to second PWM circuit 1112. In particular embodiments, second PWM circuit 1112 can generate a second pulse width modulated signal PWM2 with pulse widths that are proportional to periods of clock signal clk_del2. Further in some embodiments, an amount of phase delay provided by first phase delay circuit 1044 is selectable (by value PW2_fine) to provide finer pulse width resolution.

It is noted that while FIG. 11A shows a second clock source 1110, in an alternate embodiment a second clock source 1110 may not be included, and first clock (clk_ad) can be provided as an input clock to second phase delay circuit 1032.

As in the case of FIG. 2, in some embodiments, first clock source 1104 and second clock source 1110 can originate from a same clock generator circuit 1111.

In this way, a PWM system can phase shift input clocks to different PWM circuits, and the outputs of the PWM circuits logically combined with one another.

Figure 11B:
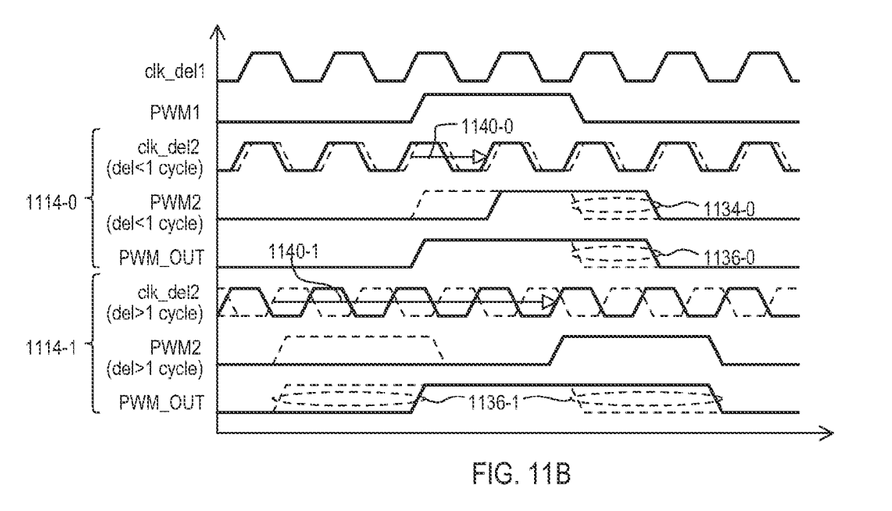

FIG. 11B is a timing diagram showing operations for a system like that shown in FIG. 11A. FIG. 11B shows waveforms for a first delayed clock signal (clk_del1) and a corresponding first pulse width modulated signal (PWM1).

FIG. 11B also shows two responses 1114-0/1. Each of responses 1114-0 shows a second delay clock signal (clk_del2), corresponding second pulse width modulated signal (PWM2), and a resulting output signal PWM_OUT.

Response 1114-0 shows an operation in which a relative delay between clk_del1 and clk_del2 is no more than a clock period. Thus, a clock delay 1140-0 and fine pulse width variation 1134-0 can be less than a clock period.

Response 1114-1 shows an operation in which a relative delay between clk_del1 and clk_del2 can exceed a clock period. Thus, a clock delay 1140-1 and fine pulse width variation 1134-1 can be longer than a clock period. However, the delay still ensures that a pulse of PWM1 overlaps that of PWM2 (assuming logically ORing of signals PWM1 and PWM2 within output logic 1106).

It is understood that the delay value (del) is a relative delay between clk_del1 and clk_del2 that can be established by setting a delay of first phase delay circuit 1044, second phase delay circuit 1032, or both.

Figure 12A:
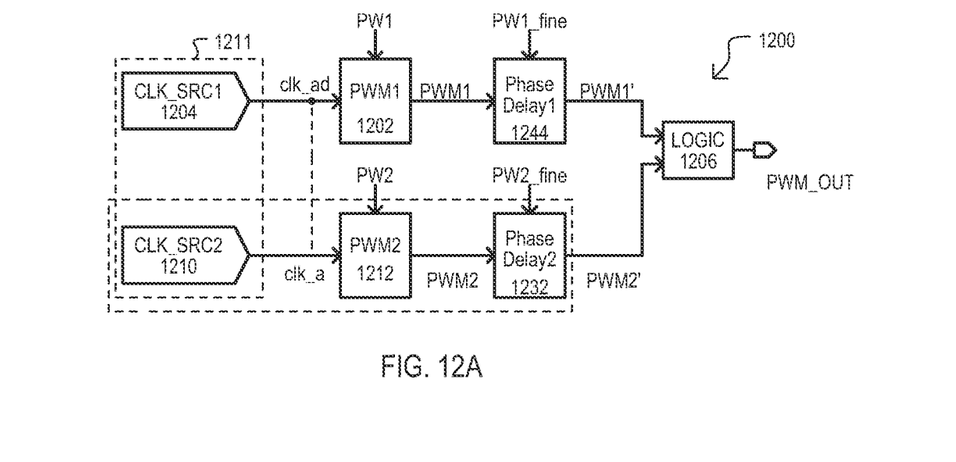
FIGS. 12A and 12B show a block schematic diagram and timing diagram of a PWM system according to another embodiment.

FIG. 12A shows a PWM system 1200 according to another embodiment. FIG. 12A can have items like those of FIG. 2. FIG. 12A differs from FIG. 2 in that a first phase delay circuit 1244 can be positioned between a first PWM circuit 1202 and output logic 1206, and a second phase delay circuit 1232 can be situated between second PWM circuit 1212 and output logic 1206.

First PWM circuit 1202 can generate a first pulse width modulated signal PWM1 in response to a first clock signal (clk_ad) provided by first clock source 1204. Signal PWM1 can be phase delayed by first phase delay circuit 1244 to create a first phase delayed pulse width modulated signal PWM1'. Signal PWM1' can be provided to output logic 1206. As in the case of FIG. 11A, in particular embodiments, first PWM circuit 1202 can generate pulse widths that are proportional to periods of clock signal clk_ad. Further in some embodiments, an amount of phase delay provided by first phase delay circuit 1244 is selectable (by value PW1_fine) to provide finer pulse width resolution.

In a similar fashion, a second pulse width modulated signal PWM2 generated by second PWM circuit 1212 in response to a second clock signal clk_a can be phase delayed by second phase delay circuit 1232. The result can be a second phase delayed pulse width modulated signal PWM2'. Signal PWM2' can also be provided to output logic 1206. Second PWM circuit 1212 can generate pulse widths that are proportional to periods of clock signal clk_a, and an amount of phase delay provided by second phase delay circuit 1232 can be selectable (by value PW2_fine).

As in the case of FIG. 11A, in an alternate embodiment a second clock source 1210 may not be included, and first clock (clk_ad) can be provided as an input clock to second PWM circuit 1212. Further, like FIG. 11A, in some embodiments, first clock source 1204 and second clock source 1210 can originate from a same clock generator circuit 1211.

In this way, a PWM system can phase delay multiple pulse width modulated signals with different delays, and logically combine the delayed signals with one another.

Figure 12B:
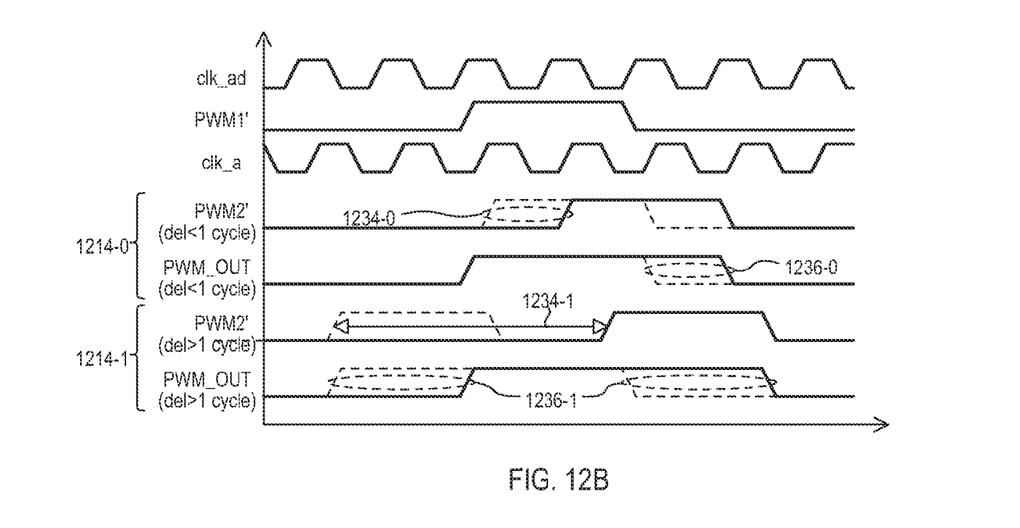

FIG. 12B is a timing diagram showing operations for a system like that shown in FIG. 12A. FIG. 12B shows waveforms for a clock signal (clk_ad), a second clock signal (clk_a), and a first delayed pulse width modulated signal (PWM1').

FIG. 12B also shows two responses 1214-0/1. Each of responses 1214-0/1 shows a second delayed pulse width modulated signal (PWM2') and a resulting output signal PWM_OUT.

Response 1214-0 shows an operation in which a relative delay between PWM1' and PWM2' is no more than a clock period. Thus, a relative phase delay 1234-0 and fine pulse width variation 1236-0 can be less than a clock period.

Response 1214-1 shows an operation in which a relative delay between PWM1' and PWM2' can be greater than a clock period. Thus, a relative phase delay 1234-1 and fine pulse width variation 1236-1 can be longer than a clock period. However, the delay is not so big that a pulse of PWM1' does not overlap that of PWM2' (assuming logically ORing of signals PWM1 and PWM2 within output logic 1206).

It is understood that the delay value (del) is a relative delay between PWM1' and PWM2' that can be established by setting a delay of first phase delay circuit 1244, second phase delay circuit 1232, or both.

Embodiments above have shown systems, circuits and corresponding methods for generating pulse width modulated signals. Additional methods will now be described with reference to flow diagrams.

Figure 13:
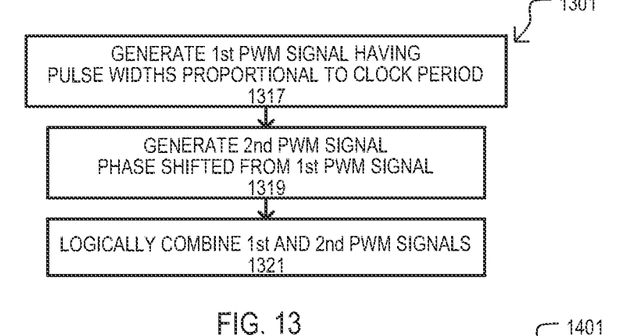
FIG. 13 is a flow diagram of a method according to an embodiment.

FIG. 13 shows a method 1301 according to an embodiment. A method 1301 can include generating a first pulse width modulated (PWM) signal having pulse widths that are proportional to a clock period (1317). Such action can include driving a PWM signal to one level (e.g., high or low) for a set number of clock periods, or clock half periods, where the number of periods/half periods is selectable by an input value. A second PWM signal can be generated that is phase shifted with respect to the first PWM signal (1319). Such an action can include phase shifting the second PWM signal so that its pulses lead and/or lag the first PWM signal by the phase shift amount. In particular embodiments, such leading/lagging can include a fraction of a clock period or a fraction of a half-clock period. First and second PWM signals can be logically combined (1321). In some embodiments, such an action can result in the phase shifted portion of the second PWM signal being added/subtracted from the first PWM signal, or vice versa. In a particular embodiment, the first and second PWM signals can be logically ORed or NORed.

Such an addition/subtraction of phase shifted portions that fall within discrete clock period steps provided by a counter based PWM circuit alone (i.e., are fractions of a clock period or half-period) can allow for higher resolution pulse widths without an increase in clock frequency.

Figure 14:
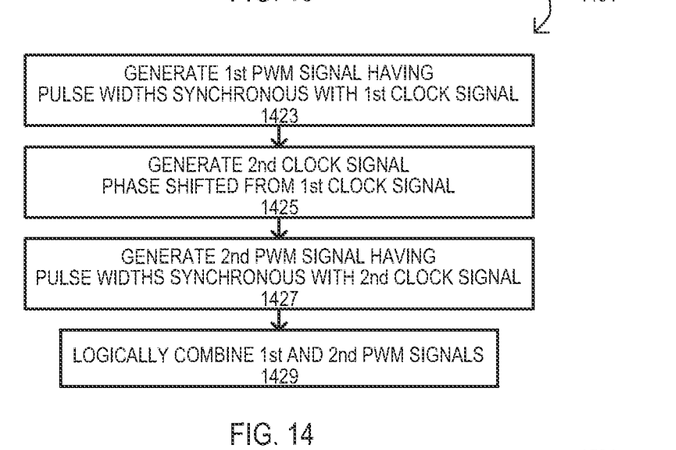
FIG. 14 is a flow diagram of a method according to another embodiment.

FIG. 14 shows a method 1401 according to a further embodiment. A method 1401 can include generating a first PWM signal having pulse widths synchronous with a first clock signal (1423). In some embodiments, such an action can include generating pulses having transitions triggered by edges of the first clock signal. A second clock signal can be generated that is phase shifted with respect to the first clock signal (1425). Such an action can result in a second clock signal that leads and/or lags the first clock signal by a phase shift amount. In particular embodiments, such leading/lagging can include a fraction of a clock period or a fraction of a half-clock period.

Method 1401 can also include generating a second PWM signal having pulse widths synchronous with the second clock signal (1427). In some embodiments, such an action can include generating pulses having transitions triggered by edges of the second clock signal. Further, due to the phase shift of the second clock signal, a resulting second PWM signal can have pulses that are phase shifted with respect to pulses of the first PWM signal (although a phase difference between the first and second PWM signals need not be the same as that between the first and second clock signals).

First and second PWM signals can be logically combined (1429). Such an action can include those variations and benefits noted for box 1321 of FIG. 13, and equivalents.

Figure 15:
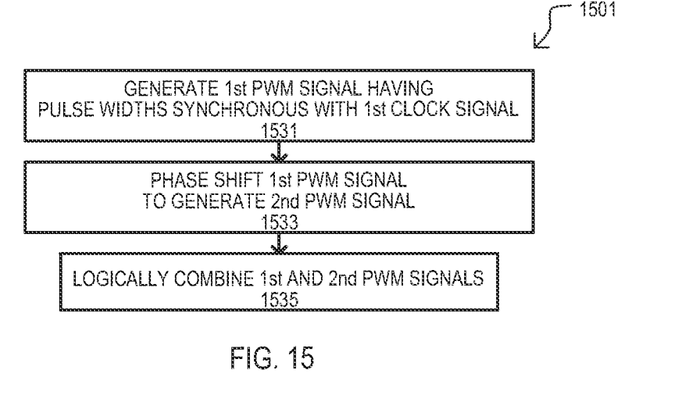
FIG. 15 is a flow diagram of a method according to a further embodiment.

FIG. 15 shows a method 1501 according to yet another embodiment. A method 1501 can include generating a first PWM signal having pulse widths synchronous with a first clock signal (1531). Such an action can include those variations noted for box 1423 of FIG. 14, and equivalents.

A method 1501 can also include phase shifting the first PWM signal to generate a second PWM signal (1533). Such an action can include phase shifting a second PWM signal (1533) so that one or both of its edges leads and/or lags the first PWM signal. In particular embodiments, such leading/lagging can include a fraction of a first clock period or a half-clock period.

First and second PWM signals can be logically combined (1535). Such an action can include those variations and benefits noted for box 1321 of FIG. 13, and equivalents.

Embodiments of the invention can include PWM systems that deliver unexpectedly high pulse resolution with a relatively low input clock frequency. Very particular system embodiments will now be described.

Figure 16A:
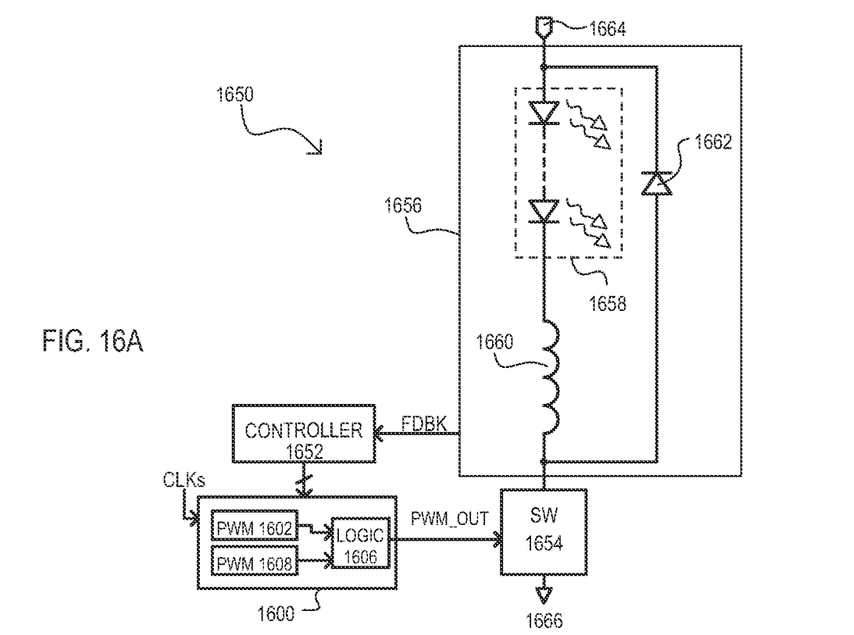
FIGS. 16A to 16C are diagrams showing lighting systems according to embodiments.

FIG. 16A shows a lighting system 1650 according to a very particular embodiment. A lighting system 1650 can be a light emitting diode (LED) lighting system that that utilizes a fine resolution PWM signal to control intensity and/or hue. A lighting system 1650 can include a PWM system 1600, a controller 1652, a current control switch 1654, and an LED lighting assembly 1656. A PWM system 1600 can be a PWM system according to any of the embodiments shown herein, or an equivalent. A PWM system 1600 can include one or more pulse width modulation circuits (one shown as 1602) that provides a first PWM signal, and one or more second PWM source circuits (one shown as 1608) that provide at least one other PWM signal that is phase shifted with respect to the first PWM signal. Output logic 1606 can logically combine multiple PWM signals (phase shifted with respect to one another) to provide a high resolution pulse width modulated output signal (PWM_OUT).

A controller 1652 can provide various control values to PWM system 1600 in response to input values, operational settings, and feedback values (FDBK) provided from LED lighting assembly 1656. Such control values can establish start up conditions, including those for any initialization operations, count values for counter based PWM circuit, and phase shift selection values that can establish a phase shift amount between multiple PWM signals.

A current control switch 1654 can selectively enable a conductive path between LED lighting assembly 1656 and one power supply node 1666 in response to output signal PWM_OUT. Such an action can regulate the amount of current flowing through LED lighting assembly 1656, and hence control intensity or hue (e.g., color mix).

An LED lighting assembly 1656 can be connected between current control switch 1654 and a second power supply node 1664. An LED lighting assembly 1656 can include one or more strings of LEDs (one shown as 1658) in series with an inductor (one shown as 1660). A "flyback" diode 1662 can be placed in parallel with series connected LED strings (e.g., 1658) and inductors (e.g., 1660). In such an arrangement, the amount of current flowing through LED strings (one shown as 1658) will vary based on a pulse width of signal PWM_OUT.

In one embodiment, a controller 1652 and PWM system 1600 can be parts of a same integrated circuit device, such as a "system-on-a-chip" type device. More particularly, such sections can be realized by a PsoC 3 or 5 device, as noted above in conjunction with FIG. 5.

Figure 16B:
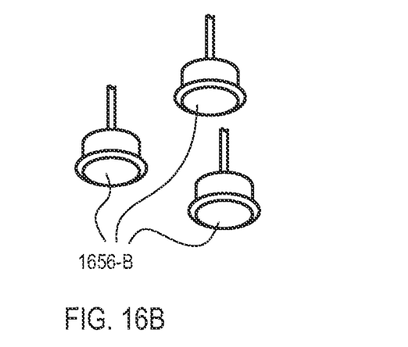
Figure 16C:
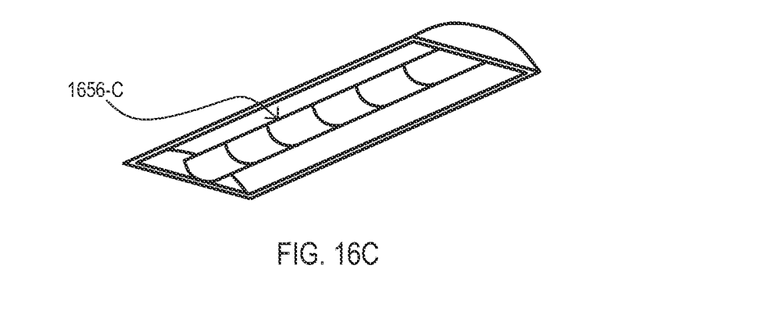

Referring now to FIGS. 16B and 16C additional examples of LED lighting systems according to embodiments are shown in diagrams. It is understood that alternate embodiments may take the forms of various other lighting devices, and the embodiments shown in FIGS. 16B and 16C should not be construed as limiting to the invention.

FIG. 16B shows portions of LED lighting assemblies 1656-B that may serve as an internal lighting device, such as suspended luminaries.

FIG. 16C shows a portion of a lighting device 1656-C that may serve as an internal lighting device, such as a "troffer" lighting assembly.

Each lighting assembly of FIGS. 16B/C (1656-B/C) can be controlled by a PWM system like those shown herein, or equivalents. Such embodiments can provide improved lighting control as finer PWM resolution can translate into finer intensity and/or hue control.

Figure 17A:
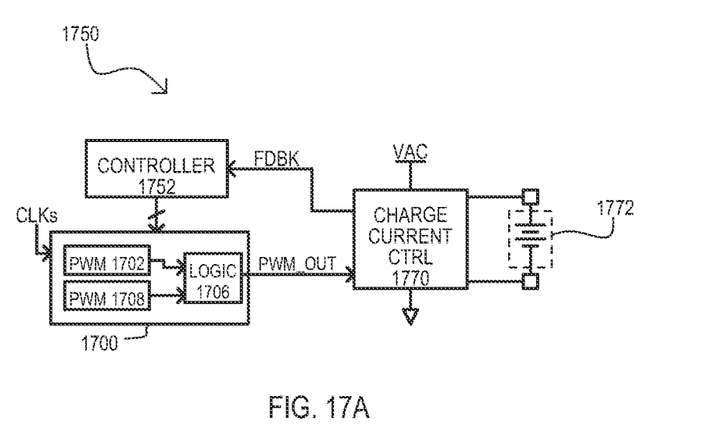
FIGS. 17A and 17B are diagrams showing charging system according to embodiments.

FIG. 17A shows a charging system 1750 according to a very particular embodiment. A charging system 1750 can be a battery charging system that can charge one or more batteries from an energy source (in this embodiment an AC voltage source (VAC)). A charging system 1750 can include a PWM system 1700, a controller 1752, and a charge current control circuit 1770.

A PWM system 1700 can include sections like those shown in 1600 of FIG. 16A, and equivalents. A controller 1752 can provide various control values to PWM system 1700 in response to input values, operational settings, and feedback values (FDBK) provided from charge current control circuit 1770. As in the case of FIG. 16A, such control values can establish start up conditions, including those for any initialization operations, count values for counter based PWM circuit, and phase shift selection values that can establish a phase shift amount between multiple PWM signals.

A charge current control circuit 1770 can provide a charging current to one or more batteries (one shown as 1772) proportional to a pulse width of signal PWM_OUT. A charge control circuit 1772 can include rectifying circuits that can convert an AC voltage (VAC) into a DC current for application to batter(ies) 1772.

As in the case of FIG. 16A, in one embodiment, a controller 1752 and PWM system 1700 can be parts of a same integrated circuit device, such as a "system-on-a-chip" type device. More particularly, such sections can be realized by a PsoC 3 or 5 device, noted above.

Figure 17B:
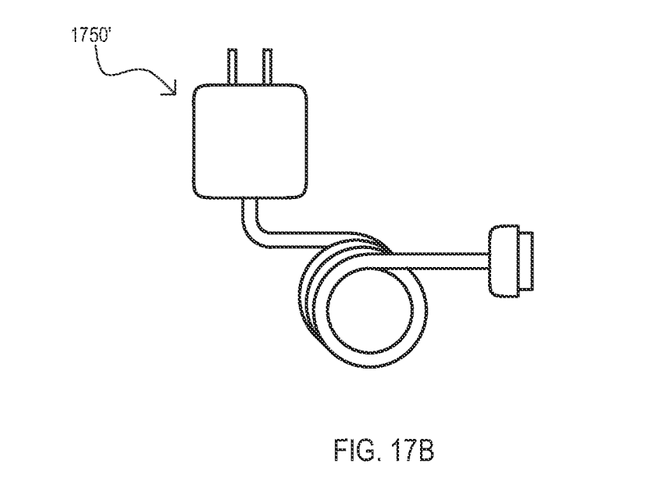

FIG. 17B shows one example of a charging system according to an embodiment. It is understood that alternate embodiments may take the forms of various other charging system, and the embodiments shown in FIG. 17B should not be construed as limiting to the invention. FIG. 17B shows a charging device 1750' that may plug into a line voltage (e.g., 120/110 VAC) to enable a portable electronic device to be charged.

Charging device 1750' can be controlled by a PWM system like those shown herein, or equivalents. Such embodiments can provide improved charging as finer PWM resolution can translate into finer current control.

Embodiments can be included in various other applications, and the particular embodiments of FIGS. 16A to 17B should not be construed as limiting.

PWM systems embodiments can include microcontroller and/or programmable hardware, including but not limited to field programmable gate arrays (FPGA) or complex programmable logic devices (CPLD), to enable high resolution PWM without the need for a high frequency input clock.

While embodiments above have shown logically combining two pulse width modulated signals, embodiments can include combining more than two pulse width modulated signals and/or selecting from multiple such signals for combination with others.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A pulse width modulation (PWM) system, comprising:
at least a PWM circuit that generates a first pulse width modulated signal in synchronism with a first clock signal;
a source circuit that provides a second pulse width modulated signal that is phase shifted with respect to the first pulse width modulated signal; and
output logic that logically combines the first and second pulse width modulated signals to generate a pulse width modulated output signal.

2. The PWM system of claim 1, wherein:
the source circuit comprises a second PWM circuit that generates the second pulse width modulated signal in synchronism with a second clock signal.

3. The PWM system of claim 2, wherein:
the source circuit further comprises a clock source circuit that generates the second clock signal that is phase shifted with respect to the first clock signal.

4. The PWM system of claim 3, wherein:
the clock source circuit provides phase shifting that is adjustable in response to adjustment input data.

5. The PWM system of claim 2, wherein:
the second clock signal has a frequency selected from: a frequency the same as that of the first clock signal and a frequency different from that of the first clock signal.

6. The PWM system of claim 1, wherein:
the output logic comprises an OR logic function and has inputs coupled to receive the first and second pulse width modulated signals.

7. The PWM system of claim 1, wherein:
the source circuit comprises a phase delay circuit having an input coupled to the output of the first PWM circuit and an output coupled to the output logic.

8. The PWM system of claim 1, wherein:
the source circuit comprises
at least a first phase delay circuit having an input coupled to receive the first clock signal, and
at least a first flip-flop circuit having a data input coupled to the output of the first PWM circuit, a data output coupled to the output logic, and a gating clock input coupled to an output of the first phase delay circuit.

9. The PWM system of claim 1, wherein:
the source circuit phase shifts the second pulse width modulated signal by less than one-half a cycle of the first clock signal.

10. The PWM system of claim 1, further including:
a first phase delay circuit in series with the first PWM circuit; and
the source circuit includes a second phase delay circuit in series with a second PWM circuit.

11. A method, comprising:
generating a first pulse width modulated signal having pulse widths synchronous with a first clock signal;
generating a second pulse width modulated signal that is phase shifted with respect to the first pulse width modulated signal; and
logically combining the first and second pulse width modulated signals to generate an output signal.

12. The method of claim 11, wherein:
the second pulse width modulated signal has pulse widths proportional to the period of the first clock signal.

13. The method of claim 11, wherein:
generating the second pulse width modulated signal includes phase shifting the first pulse width modulated signal.

14. The method of claim 13, wherein:
phase shifting the first pulse width modulated signal includes
phase shifting the first clock signal, and
gating the first pulse width modulated signal to the output logic in response to the first clock signal to generate the second pulse width modulated signal.

15. The method of claim 11, wherein:
the phase shift of the second pulse width modulated signal is less than one-half a cycle of the first clock signal.

16. The method of claim 11, wherein:
generating the first pulse width modulated signal includes generating pulse widths based on counting cycles of the first clock signal;
generating the second pulse width modulated signal includes
generating pulse widths based on counting cycles of a second clock signal to generate an initial pulse width modulated signal, and
phase shifting the initial pulse width modulated signal to generate the second pulse width modulated signal.

17. A pulse width modulation (PWM) system, comprising:
a first PWM circuit that varies a pulse width of a first pulse width modulated signal in proportion to a first input clock signal period in response to a first pulse width value; and
output logic that logically combines the first pulse width modulated signal with a second pulse width modulated signal to generate an output signal.

18. The PWM system of claim 17, further including:
a source circuit comprising a second pulse width modulation circuit that varies a pulse width of the second pulse width modulated signal in proportion to a second input clock signal period in response to a second pulse width value.

19. The PWM system of claim 17, further including:
a source circuit comprising a phase shift circuit configured to phase shift the first pulse width modulated signal to generate the second pulse width modulated signal.

20. The PWM system of claim 17, further including:
a light emitting diode assembly having a switching input coupled to receive the output signal.

* * * * *